(12) United States Patent
Park

(10) Patent No.: US 9,437,820 B2
(45) Date of Patent: Sep. 6, 2016

(54) SUBSTRATE LAMINATING LOWER FILM AND SUBSTRATE LAMINATED STRUCTURE AND METHOD OF MANUFACTURING ORGANIC LIGHT EMITTING DISPLAY APPARATUS USING THE SAME

(71) Applicant: Samsung Display Co., Ltd., Yongin, Gyeonggi-Do (KR)

(72) Inventor: Jin Han Park, Hwaseong-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 154 days.

(21) Appl. No.: 14/040,540

(22) Filed: Sep. 27, 2013

(65) Prior Publication Data

US 2014/0356567 A1 Dec. 4, 2014

(30) Foreign Application Priority Data

Jun. 3, 2013 (KR) .................. 10-2013-0063550

(51) Int. Cl.
*B32B 3/10* (2006.01)
*B32B 7/06* (2006.01)
*B32B 7/14* (2006.01)
(Continued)

(52) U.S. Cl.
CPC ............... *H01L 51/003* (2013.01); *B32B 7/06* (2013.01); *B32B 7/14* (2013.01); *H01L 51/0013* (2013.01); *B32B 3/26* (2013.01); *B32B 37/025* (2013.01); *B32B 37/12* (2013.01); *B32B 37/1207* (2013.01); *B32B 37/1292* (2013.01); *B32B 37/18* (2013.01); *B32B 37/185* (2013.01); *B32B 37/187* (2013.01); *B32B 38/10* (2013.01); *B32B 43/00* (2013.01); *H01L 51/50* (2013.01); *Y10T 156/10* (2015.01); *Y10T 428/23* (2015.01); *Y10T 428/24331* (2015.01); *Y10T 428/24752* (2015.01); *Y10T 428/24802* (2015.01); *Y10T 428/24843* (2015.01); *Y10T 428/24942* (2015.01); *Y10T 428/24959* (2015.01); *Y10T 428/2843* (2015.01); *Y10T 428/2848* (2015.01)

(58) Field of Classification Search
None
See application file for complete search history.

(56) References Cited

U.S. PATENT DOCUMENTS 4,818,621 A * 4/1989 Kuroda ............... C09J 4/06
257/E21.214
6,458,234 B1 * 10/2002 Lake et al. ............... 156/230
(Continued)

FOREIGN PATENT DOCUMENTS

EP 616018 A1 * 9/1994
GB 2122166 A * 1/1984 ......... B65D 75/5855
(Continued)

OTHER PUBLICATIONS

Polythene (polyethylene):Properties, Production & Uses, Jun. 2002.*
(Continued)

*Primary Examiner* — Jeff Vonch
(74) *Attorney, Agent, or Firm* — Knobbe Martens Olson & Bear LLP

(57) ABSTRACT

A substrate laminating low film, a substrate laminated structure and a method of manufacturing an organic light emitting display are disclosed. One inventive aspect includes a base member, a first adhesion layer formed on the base member, and a second adhesion layer formed on the first adhesion layer. The second adhesion layer has a second adhesion strength less than the first adhesion strength of the first adhesion layer.

12 Claims, 15 Drawing Sheets

(51) Int. Cl.
*B32B 37/12* (2006.01)
*B32B 37/18* (2006.01)
*B32B 37/30* (2006.01)
*B32B 38/10* (2006.01)
*B32B 43/00* (2006.01)
*H01L 51/56* (2006.01)
*H01L 51/00* (2006.01)
*H01L 51/50* (2006.01)
*B32B 37/00* (2006.01)
*B32B 3/26* (2006.01)

(56) References Cited

U.S. PATENT DOCUMENTS

| | | | | |
|---|---|---|---|---|
| 7,361,573 | B2* | 4/2008 | Takayama | H01L 21/76251 257/E21.567 |
| 7,892,385 | B2* | 2/2011 | Baek | B32B 37/12 156/230 |
| 7,927,679 | B2* | 4/2011 | Cruz | B32B 7/10 428/355 EN |
| 2003/0121599 | A1* | 7/2003 | Yamamoto | H01L 21/67132 156/247 |
| 2005/0048295 | A1* | 3/2005 | Kim | B32B 7/02 428/447 |
| 2005/0048316 | A1* | 3/2005 | Kim | C09K 11/06 428/690 |
| 2005/0208736 | A1* | 9/2005 | Matsumura | C09J 7/02 438/460 |
| 2006/0112543 | A1* | 6/2006 | Ishikawa et al. | 29/830 |
| 2006/0154066 | A1* | 7/2006 | Kita | C09J 7/0207 428/401 |
| 2007/0014944 | A1* | 1/2007 | Matsumoto | B29C 43/003 428/32.81 |
| 2007/0175582 | A1* | 8/2007 | Baek et al. | 156/247 |
| 2009/0094874 | A1* | 4/2009 | Smith | A47G 1/0633 40/760 |
| 2009/0104467 | A1* | 4/2009 | Son et al. | 428/516 |
| 2009/0252912 | A1* | 10/2009 | Yasuike | 428/41.3 |
| 2012/0100651 | A1* | 4/2012 | Park | H01L 51/003 438/34 |
| 2012/0107615 | A1* | 5/2012 | Hetzler | B32B 7/02 428/412 |
| 2012/0107978 | A1* | 5/2012 | Shin | H01L 51/5253 438/29 |
| 2012/0210055 | A1* | 8/2012 | Mace et al. | 711/105 |
| 2012/0235315 | A1* | 9/2012 | Wu | H01L 21/6835 264/104 |
| 2012/0270461 | A1* | 10/2012 | Kim | H01L 51/0024 445/24 |
| 2013/0133835 | A1* | 5/2013 | Lee | H01L 51/56 156/379.6 |
| 2013/0188324 | A1* | 7/2013 | Lee | H01L 27/1218 361/750 |
| 2013/0255873 | A1* | 10/2013 | Watts | H01L 21/6835 156/247 |
| 2013/0273292 | A1* | 10/2013 | Kim et al. | 428/40.1 |
| 2014/0038349 | A1* | 2/2014 | Kang | H01L 51/0013 438/99 |
| 2014/0326404 | A1* | 11/2014 | Kang | B32B 37/10 156/285 |
| 2014/0332163 | A1* | 11/2014 | Hwang | B32B 37/025 156/382 |
| 2015/0083341 | A1* | 3/2015 | Everaerts | B32B 43/006 156/711 |
| 2015/0144932 | A1* | 5/2015 | Bae | H01L 51/5253 257/40 |

FOREIGN PATENT DOCUMENTS

| | | | | |
|---|---|---|---|---|
| JP | WO 2009051071 A1 | * | 4/2009 | H01L 21/481 |
| JP | 2010141367 A | * | 6/2010 | |
| KR | 20-0384187 Y1 | | 5/2005 | |
| KR | 10-2010-0101332 A | | 9/2010 | |
| KR | 10-2010-0130045 A | | 12/2010 | |
| WO | WO 2011158835 A1 | * | 12/2011 | H01L 21/67132 |

OTHER PUBLICATIONS

Machine Translation of EP 616018 A1, Sep. 1994.*
Machine Translation of JP 2010141367 A, Jun. 2010.*
Machine Translation of WO 2011158835 A1, Dec. 2011.*
Pocius, Adhesion Science and Engineering: Surfaces, Chemistry and Applications, Nov. 2002, Elsevier.*
NPCS Board of Consultants & Engineers, The Complete Book on Adhesives, Glues & Resins Technology, Oct. 2007, Asia Pacific Business Press Inc.*

* cited by examiner

SUBSTRATE LAMINATING LOWER FILM AND SUBSTRATE LAMINATED STRUCTURE AND METHOD OF MANUFACTURING ORGANIC LIGHT EMITTING DISPLAY APPARATUS USING THE SAME

CROSS-REFERENCE TO RELATED APPLICATIONS

This application claims priority from Korean Patent Application No. 10-2013-0063550 filed on Jun. 3, 2013 in the Korean Intellectual Property Office, and all the benefits accruing therefrom under 35 U.S.C. 119, the contents of which in its entirety are herein incorporated by reference.

BACKGROUND

1. Field

The disclosed technology generally relates to a substrate laminating lower film, a substrate laminated structure and a method of manufacturing an organic light emitting diode display.

2. Description of the Related Technology

In recent years, among various kinds of display devices, organic light emitting diode (OLED) displays have received much attention because of low power consumption and superior color reproducibility. An OLED generally includes a cathode electrode, an anode electrode and a light emitting layer. When a voltage is applied to the cathode electrode and the anode electrode, visible light is emitted from the light emitting layer.

For color display, an OLED display generally includes a red light emitting layer, a green light emitting layer and a blue light emitting layer.

These light emitting layers are generally formed using a deposition or a transfer method. Specifically, the transfer method using a doner film has high processing efficiency and recently receives widely attentions. When a light emitting layer is formed using the transfer method, a lamination process between a substrate and a doner film is performed. In order to firmly maintain the substrate-doner film lamination, a method of laminating the doner film to a lower film under the substrate is considered here. However, if the doner film is cured or is not made of a thermally meltable material, thermal lamination of the lower film may not be performed properly and it will be difficult to secure sufficient adhesion.

It is important to increasing an adhesive strength between the lower film and the doner film for maintaining the adhesion inbetween. However, it may also cause rupture of a film and non-uniformity in a subsequent peeling process and result in a mura phenomenon.

SUMMARY OF CERTAIN INVENTIVE ASPECTS

The disclosed technology provides a substrate laminating lower film, which can reduce film rupture and non-uniformity in a subsequent peeling process while providing appropriate adhesion with respect to a doner film.

The disclosed technology also provides a substrate laminated structure, which enables stable lamination and peeling.

The disclosed technology also provides a method of manufacturing an organic light emitting display apparatus, which can transfer a light emitting layer in a stable manner and preventing a mura phenomenon by overcoming a problem of non-uniformity in peeling.

These and other objects of the disclosed technology will be described in or be apparent from the following description of the preferred embodiments.

According to an aspect of the disclosed technology, there is provided a substrate laminating lower film including a base member, a first adhesion layer formed on the base member and having first adhesion, and a second adhesion layer formed on the first adhesion layer and having second adhesion smaller than the first adhesion.

According to another aspect of the disclosed technology, there is provided a substrate laminated structure including a base member, a first adhesion layer formed on the base member and having first adhesion, a second adhesion layer formed on the first adhesion layer and having second adhesion smaller than the first adhesion, a target substrate disposed on the second adhesion layer of the substrate laminating lower film, and a doner film covering the target substrate and the second adhesion layer and having at least a portion attached to the second adhesion layer.

According to still another aspect of the disclosed technology, there is disclosed a method of manufacturing an organic light emitting display apparatus, the method including providing a substrate laminating lower film including a base member, a first adhesion layer formed on the base member and having first adhesion, and a second adhesion layer formed on the first adhesion layer and having second adhesion smaller than the first adhesion, disposing a target substrate for an organic light emitting display apparatus on the second adhesion layer of the lower film, disposing a doner film on the lower film and the target substrate to attach the target substrate to the doner film and make the second adhesion layer and the doner film contact each other, and heating contact portions between the second adhesion layer and the doner film to attach the second adhesion layer and the doner film to each other.

According to still another aspect of the disclosed technology, there disclosed an apparatus for manufacturing an organic light emitting display. The apparatus comprises means for providing a substrate laminating lower film including a base member, a first adhesion layer and a second adhesion layer, means for disposing a target substrate on the lower film, and means for disposing a doner film on the lower film and the target substrate.

Embodiments of the disclosed technology disclose at least the following effects.

In the substrate laminating lower film according to embodiments of the disclosed technology, appropriate adhesion with respect to a doner film can be disclosed and film rupture and non-uniformity in a subsequent peeling process can be suppressed.

In addition, in the substrate laminated structure according to embodiments of the disclosed technology, stable lamination is achieved, thereby facilitating stable transfer of a target substrate and easily peeling a lower film.

Further, in the method of manufacturing an organic light emitting display apparatus according to embodiments of the disclosed technology, appropriate adhesion with respect to a doner film can be disclosed and film rupture and non-uniformity in a subsequent peeling process can be suppressed, thereby transferring a light emitting layer in a stable manner while preventing a mura phenomenon.

BRIEF DESCRIPTION OF THE DRAWINGS

The above and other features and advantages of the disclosed technology will become more apparent by describing in detail preferred embodiments thereof with reference to the attached drawings in which.

DETAILED DESCRIPTION OF CERTAIN INVENTIVE EMBODIMENTS

Figure 1:
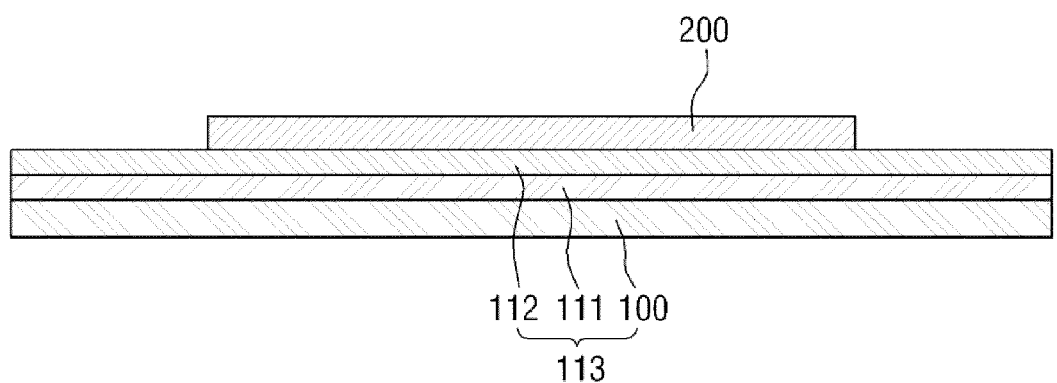
FIG. 1 is a cross-sectional view of a substrate laminating lower film having a substrate according to an embodiment of the disclosed technology laminated thereon.

Advantages and features of the disclosed technology and methods of accomplishing the same may be understood more readily by reference to the following detailed description of preferred embodiments and the accompanying drawings. The disclosed technology may, however, be embodied in many different forms and should not be construed as being limited to the embodiments set forth herein. Rather, these embodiments are disclosed so that this disclosure will be thorough and complete and will fully convey the concept of the invention to those skilled in the art, and the disclosed technology will only be defined by the appended claims. Like reference numerals refer to like elements throughout the specification.

The drawings and description are to be regarded as illustrative in nature and not restrictive. Like reference numerals designate like elements throughout the specification.

Further, since sizes and thicknesses of constituent members shown in the accompanying drawings are arbitrarily given for better understanding and ease of description, the disclosed technology is not limited to the illustrated sizes and thicknesses.

In the drawings, the thickness of layers, films, panels, regions, etc., are exaggerated for clarity. In the drawings, for better understanding and ease of description, the thicknesses of some layers and areas are exaggerated. It will be understood that when an element such as a layer, film, region, or substrate is referred to as being "on" another element, it may be directly on the other element or intervening elements may also be present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosed technology.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the disclosed technology.

Unless otherwise defined, all terms (including technical and scientific terms) used herein have the same meaning as commonly understood by one of ordinary skill in the art to which the disclosed technology belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 2:
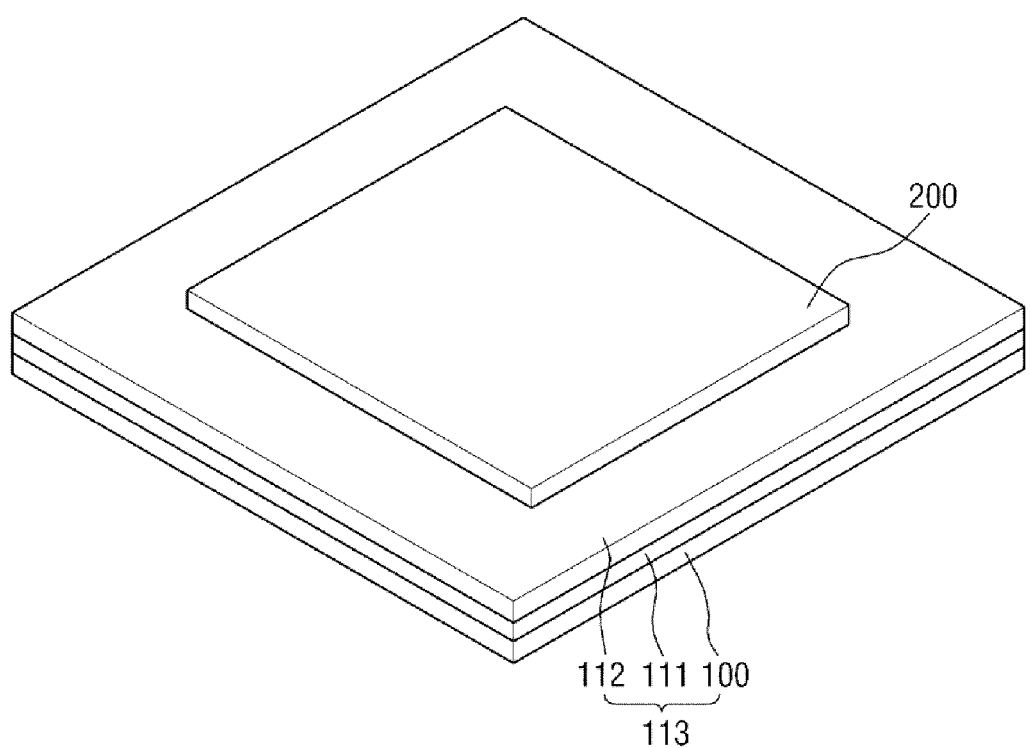
FIG. 2 is a perspective view of the substrate laminating lower film shown in FIG. 1.

Hereinafter, embodiments of the disclosed technology will be described with reference to the accompanying drawings. FIG. 1 is a cross-sectional view of a substrate laminating lower film having a substrate according to an embodiment of the disclosed technology laminated thereon. FIG. 2 is a perspective view of the substrate laminating lower film shown in FIG. 1.

Referring to FIGS. 1 and 2, the substrate laminating lower film 113 is used in laminating a target substrate 200 and a doner film. In addition, the substrate laminating lower film 113 may also be used as a conveying support that conveys the target substrate 200 while protecting the same. In an exemplary implementation, the substrate laminating lower film 113 is used as a support for conveying the target substrate 200 to a thermal transfer processing apparatus. The thermal transfer processing apparatus performs a laser induced thermal transfer process.

The target substrate 200 is disposed on the substrate laminating lower film 113. The target substrate 200 and the substrate laminating lower film 113 are covered by the doner film. In order to directly attach the substrate laminating lower film 113 to the doner film, the substrate laminating lower film 113 may be larger than the target substrate 200 in size. The target substrate 200 is disposed at a central portion of the substrate laminating lower film 113. Peripheries of the substrate laminating lower film 113 may be exposed.

The target substrate 200 may be a substrate for a display or a panel for a display, such as an organic light emitting display (OLED), a liquid crystal display (LCD), an electrophoretic display device, or a plasma display panel (PDP). In addition, the target substrate 200 may be a bare substrate or a substrate having a structure such as a thin film or a wiring.

The substrate laminating lower film 113 includes a base member 100, a first adhesion layer 111 and a second adhesion layer 112. The first adhesion layer 111 and the second adhesion layer 112 are sequentially stacked on the base member 100.

The base member 100 may be positioned at the bottommost portion of the substrate laminating lower film 113. In some exemplary implementations, the base member 100 is made of at least one of polyethylene terephthalate (PET), polystyrene (PS), or polyphenylene ether.

In the substrate laminating lower film 113, the base member 100 may protect the target substrate 200 and/or serve as a conveying support. To this end, the base member 100 may have a sufficiently high strength and a sufficiently great thickness. In an exemplary implementation, the base member 100 has a thickness in a range of 100 to 500 μm. If the thickness of the base member 100 is greater than or equal to 100 μm, film sagging may be reduced when the film is conveyed between chambers through a robot or a conveyor. In turn, this facilitates the film conveyance. If the thickness of the base member 100 is smaller than or equal to 500 μM, adhesion between the base member 100 and the doner film can be properly maintained and non-uniformity can be prevented during a roll peeling process.

The first adhesion layer 111 is formed on the base member 100 and the second adhesion layer 112 is formed on the first adhesion layer 111. The first adhesion layer 111 and the second adhesion layer 112 may be thermally adhesive layers, respectively.

The second adhesion layer 112 directly contacts the target substrate 200. In addition, the second adhesion layer 112 may directly contact the peripheries or terminals of the doner film covering the target substrate 200.

The first adhesion layer 111 has first adhesion and the second adhesion layer 112 may have second adhesion smaller than the first adhesion. Here, the term "adhesion" may mean a bonding force of an interface between an adhesive layer and an object to be adhered, that is, a force applied when two objects stick to each other.

The first adhesion layer 111 has first adhesion, which is relatively strong. The first adhesion layer 111 powerfully adheres to the second adhesion layer 112 and the base member 100 together.

The second adhesion layer 112 has second adhesion, which is relatively weak. The second adhesion layer 112 assists in peeling. In an exemplary implementation of an organic light emitting display manufacturing process, the target substrate 200 is disposed on the second adhesion layer 112, the resultant structure is covered by the doner film, and the peripheries or terminals of the doner film is attached to the second adhesion layer 112. Here, since the second adhesion layer 112 has relatively weak second adhesion, permanent adhesion between the second adhesion layer 112 and the doner film may not be exhibited. Accordingly, the substrate laminating lower film 113 may be easily removed without non-uniformity in a subsequent peeling process.

The second adhesion layer 112 may have a lower melting point than the first adhesion layer 111 or the base member 100. If the second adhesion layer 112 is heated to its melting point or higher to be attached to the doner film, a second material forming the second adhesion layer 112 starts to be melted earlier than a first material forming the first adhesion layer 111 and the base member 100 and therefore, the second exerting adhesion with respect to the doner film. If the heating temperature is maintained to be lower than the melting point of the second adhesion layer 112 and to be lower than the melting points of the first adhesion layer 111 and the base member 100, crystallinity of the first adhesion layer 111 and the base member 100 may not be broken. Since adhesion of an adhesive layer further increases while its temperature increases more than a melting point, the adhesion of the second adhesion layer 112 increases when its temperature increases between the melting point of the second adhesion layer 112 and the melting point of the first adhesion layer 111.

The first adhesion layer 111 and the second adhesion layer 112 may be made of polyolefin-based resins, respectively. In an exemplary embodiment, the second adhesion layer 112 is made of an inhomogeneous polyolefin-based resin and the first adhesion layer 111 is made of a homogenous polyolefin-based resin.

In another embodiment, the second adhesion layer 112 includes inhomogeneous polyethylene and the first adhesion layer 111 includes homogenous polyethylene. Since inhomogeneous polyethylene has alkyl branches irregularly formed in its linear chain, crystallinity between polymers is low at a low temperature. Since homogenous polyethylene has no alky branch or few alkyl branches in its linear chain, crystallinity between polymers is very high. Therefore, inhomogeneous polyethylene with low crystallinity is first melted by heating, while homogenous polyethylene with high crystallinity maintains its crystal forms.

In some other embodiments, the first adhesion layer 111 and the second adhesion layer 112 are formed by blending an inhomogeneous polyolefin-based resin, e.g., inhomogeneous polyethylene, and a homogenous polyolefin-based resin, e.g., homogenous polyethylene. A mixing ratio between the first adhesion layer 111 and the second adhesion layer 112 varies in different manners. In an exemplary embodiment, a melting point of the second adhesion layer 112 is controlled to be lower than that of the first adhesion layer 111 by adjusting a ratio between inhomogeneous polyethylene and homogenous polyethylene with respect to the second adhesion layer 112 to be higher than that with respect to the first adhesion layer 111.

In an exemplary embodiment, the first adhesion layer 111 and the second adhesion layer 114 have the same thickness. In another exemplary implementation, a total thickness of the first adhesion layer 111 and the second adhesion layer 114 is in a range of 10 to 100 µm. If the total thickness of the first adhesion layer 111 and the second adhesion layer 114 is greater than or equal to 10 µm and the temperature is greater than the melting point of the second adhesion layer 114, the thickness of the second adhesion layer 114 is reduced and adhesion may be exhibited without being broken. In addition, if the total thickness of the first adhesion layer 111 and the second adhesion layer 114 is smaller than or equal to 100 µm, adhesion between the base member 100 and the doner film may be well maintained.

Figure 3:
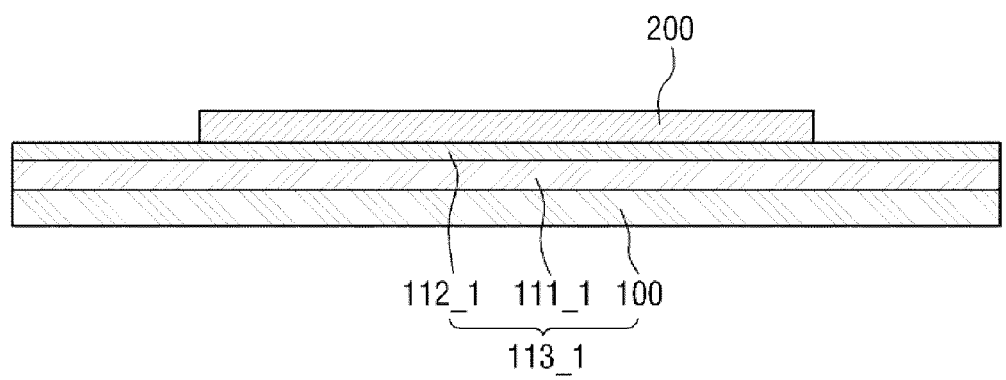
FIG. 3 is a cross-sectional view of a substrate laminating lower film according to another embodiment of the disclosed technology.

FIG. 3 is a cross-sectional view of a substrate laminating lower film according to another embodiment of the disclosed technology.

Referring to FIG. 3, the substrate laminating lower film 113_1 according to the embodiment of the disclosed technology is different from the substrate laminating lower film 113 according to the previous embodiment shown in FIG. 1 because a thickness of a first adhesion layer 111_1 is greater than that of a second adhesion layer 112_1.

In details, the second adhesion layer 112_1 has a relatively low melting point and exhibits adhesion as the result of heating. If the second adhesion layer 112_1 has a relatively small thickness and heat conduction is well performed on the overall second adhesion layer 112_1 as the result of heating, the second adhesion layer 112_1 achieving effective adhesion. In addition, when the thickness of the first adhesion layer 111_1 is relatively large, a cushioning function can be exhibited. Thus, functions of protecting a target substrate 200 of a base member 100 and serving as a conveying support can be advantageously achieved.

A ratio between a thickness of the second adhesion layer 112_1 and a thickness of the first adhesion layer 111_1 may be approximately 3:7 to approximately 4:6. In an exemplary implementation, a total thickness of the first adhesion layer 111_1 and the second adhesion layer 112_1 is in a range of 10 to 100 µm.

Figure 4:
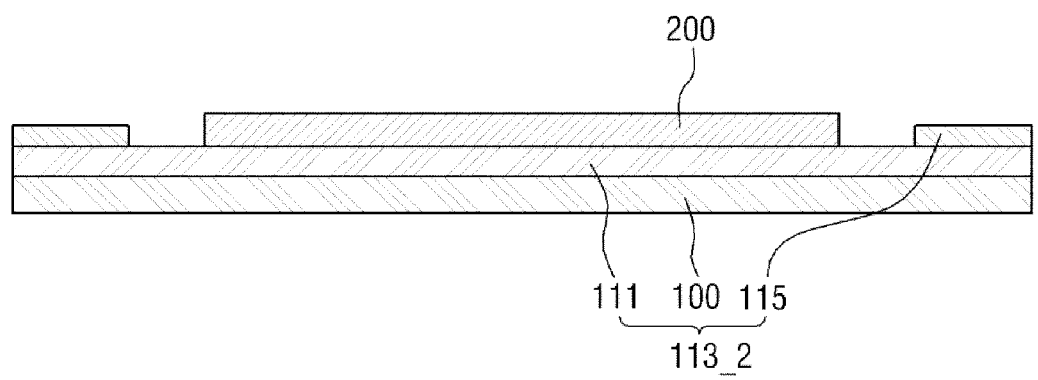
FIGS. 4 and 5 are a cross-sectional view and a perspective view of a substrate laminating lower film according to still another embodiment of the disclosed technology.
Figure 5:
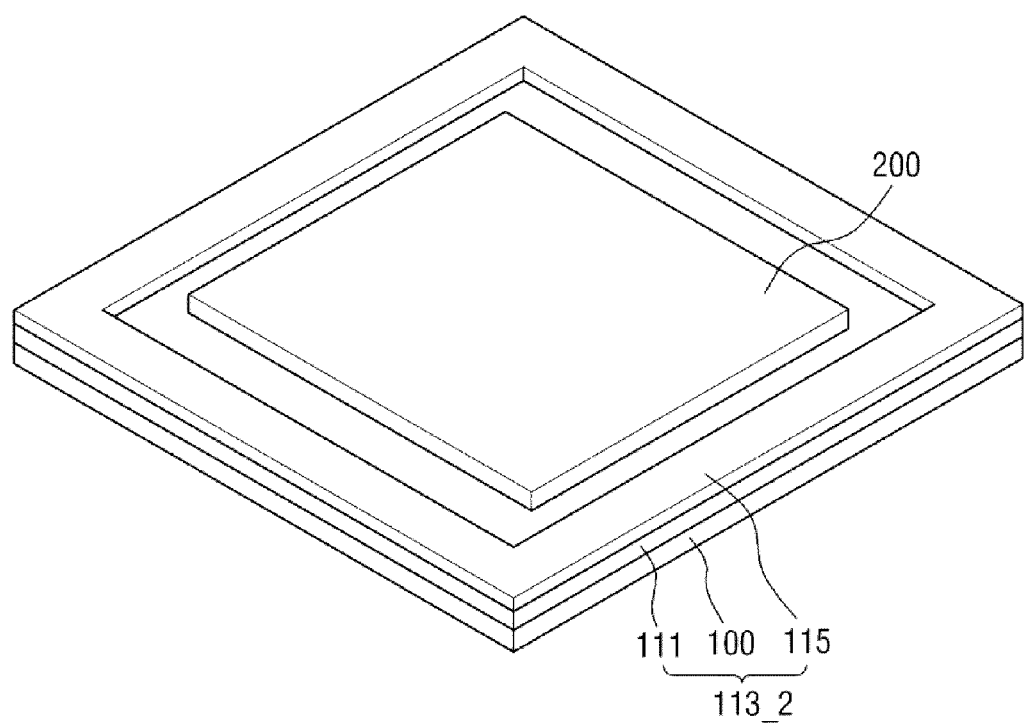

FIGS. 4 and 5 are a cross-sectional view and a perspective view of a substrate laminating lower film according to still another embodiment of the disclosed technology.

Referring to FIGS. 4 and 5, the substrate laminating lower film 113_2 according to the embodiment of the disclosed technology is different from the substrate laminating lower film 113 according to the previous embodiment shown in FIG. 1 in that a second adhesion layer 115 is not formed on the entire surface of a first adhesion layer 111 but is formed only on the edge of the first adhesion layer 111.

In details, the second adhesion layer 115 may be shaped to define a window opened at its central portion. The central portion of the first adhesion layer 111 may be exposed through the open window. Referring to FIGS. 4 and 5, a target substrate 200 disposed on the exposed surface of the first adhesion layer 111 and the peripheries of a doner film covering the target substrate 200 are adhered to the second adhesion layer 115.

The target substrate 200 is disposed inside the window of the second adhesion layer 115 to be spaced apart from the second adhesion layer 115. Sides of the target substrate 200 and the second adhesion layer 115 may be equally spaced apart from each other. In some embodiments, the target substrate 200 is disposed such that its one side contacts one surface of the second adhesion layer 115 or partially overlaps a top surface of the second adhesion layer 115.

A thickness of the second adhesion layer 115 may be smaller than that of the target substrate 200. If the thickness of the second adhesion layer 115 is smaller than that of the target substrate 200, a surface of the target substrate 200 protrudes relative to a surface of the second adhesion layer 115 so that the doner film and the target substrate 200 may easily contact with each other when a substrate laminated structure is formed by covering the doner film over the target substrate 200.

Figure 6:
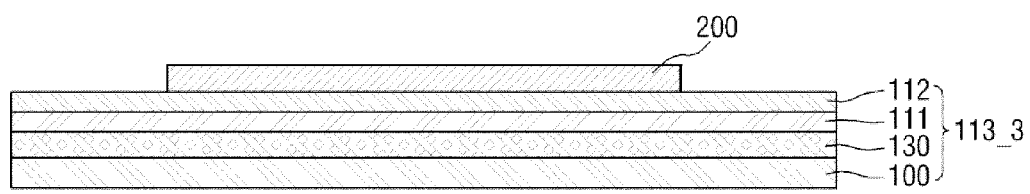
FIG. 6 is a cross-sectional view of a substrate laminating lower film according to still another embodiment of the disclosed technology.

FIG. 6 is a cross-sectional view of a substrate laminating lower film according to still another embodiment of the disclosed technology.

Referring to FIG. 6, the substrate laminating lower film 113_3 according to an embodiment of the disclosed technology is different from the substrate laminating lower film 113 according to the previous embodiment shown in FIG. 1 in that a barrier layer 130 is further provided between a base member 100 and a first adhesion layer 111.

The barrier layer 130 may prevent oxygen and moisture from penetrating from the base member 100 due to maintenance of vacuum degree and exposure to the air and therefore protect the target substrate 200 disposed thereon. In addition, the barrier layer 130 may protect the target substrate 200 or the base member 100, prevent the base member 100 from absorbing external moisture to then be swollen, and prevent the target substrate 200 from being deformed.

In an exemplary implementation, the barrier layer 130 has moisture permeability of 1.0 g/m²·day or less. The barrier layer 130 may be made of an inorganic material. In another exemplary implementation, the barrier layer 130 includes oxide, nitride or oxynitride of silicon.

The oxide of silicon may be represented by $SiO_x$ and may satisfy an inequation $1.4<x<2.0$ to meet the requirement of moisture barrier property.

The nitride of silicon may be represented by $SiN_y$ and may satisfy an inequation $0.5<y<1.5$ to meet the requirement of moisture barrier property.

The oxynitride of silicon may be represented by $SiO_xN_y$ and may satisfy inequations $0<x<0.8$ and $0.8<y<1.3$ to meet the requirement of moisture barrier property.

In other embodiments, the barrier layer 130 may be made of oxide/nitride/oxynitride of aluminum, or diamond like carbon (DLC). In addition, the barrier layer 130 may be made of a mixture of two or more materials selected from the group consisting of oxide, nitride or oxynitride of silicon, oxide/nitride/oxynitride of aluminum, or diamond like carbon (DLC).

In some exemplary implementations, the barrier layer 130 has a thickness in a range of 3 to 1000 nm. If the thickness of the barrier layer 130 is greater than or equal to 3 nm, penetration of oxygen and moisture can be effectively prevented. If the thickness of the barrier layer 130 is smaller than or equal to 1000 nm, sufficiently high adhesion between the base member 100 and the first adhesion layer 111 can be maintained.

Figure 7:
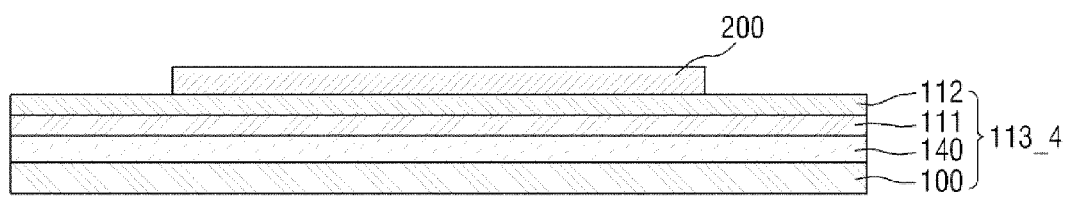
FIG. 7 is a cross-sectional view of a substrate laminating lower film according to still another embodiment of the disclosed technology.

FIG. 7 is a cross-sectional view of a substrate laminating lower film according to still another embodiment of the disclosed technology.

Referring to FIG. 7, the substrate laminating lower film 113_4 according to an embodiment of the disclosed technology is different from the substrate laminating lower film 113 of FIG. 1 in that a primer layer 140 is further provided between a base member 100 and a first adhesion layer 111.

The primer layer 140 further improves adhesion between the base member 100 and the first adhesion layer 111. The primer layer 140 may be made of a polymeric material having a superior adhesive property. In an exemplary implementation, the primer layer 140 includes one or more materials selected from a group consisting of polyester, polyester, polyacrylate, silicone acrylic resin, methacrylic resin, acrylic resin, melamine resin and polysiloxane resin.

The primer layer 140 may not perform functions of protecting the target substrate 200 of the base member 100 and serving as a conveying support, but may provide higher adhesion than the first adhesion layer 111 having first adhesion, thereby more firmly adhering the base member 100 and the first adhesion layer 111 to each other.

The primer layer 140 may have a sufficiently large thickness to improve adhesion between the base member 100 and the first adhesion layer 111. In an exemplary implementation, the primer layer 140 has a thickness in a range of 50 to 1000 nm. If the thickness of the primer layer 140 is greater than or equal to 50 nm, sufficiently high adhesion between the base member 100 and the first adhesion layer 111 can be provided. In addition, if the thickness of the primer layer 140 is smaller than or equal to 1000 nm, the primer layer 140 is sufficiently dried to maintain adhesion between the base member 100 and the first adhesion layer 111 without a reduction in the adhesion.

Figure 8:
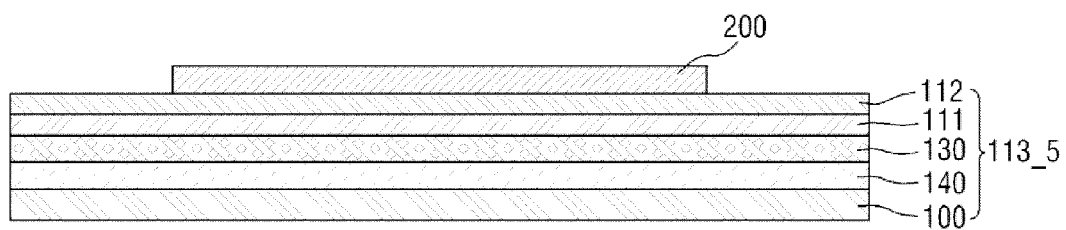
FIG. 8 is a cross-sectional view of a substrate laminating lower film according to still another embodiment of the disclosed technology.

FIG. 8 is a cross-sectional view of a substrate laminating lower film according to still another embodiment of the disclosed technology.

Referring to FIG. 8, the substrate laminating lower film 113_5 according to an embodiment of the disclosed technology is different from the substrate laminating lower film 113 of FIGS. 6 and 7 in that both the barrier layer 130 and the primer layer 140 are provided. In the present embodiment shown in FIG. 8, since both of the barrier layer 130 and the primer layer 140 are provided, high adhesion between a base member 100 and a first adhesion layer 111 can be exhibited and oxygen and moisture can be prevented from penetrating due to exposure to the air. The barrier layer 130 and the primer layer 140 are substantially the same as those described above with reference to FIGS. 6 and 7. Therefore, arepeated explanations thereof will be omitted.

Hereinafter, a substrate laminated structure formed using the aforementioned substrate laminating lower film will be described.

Figure 9:
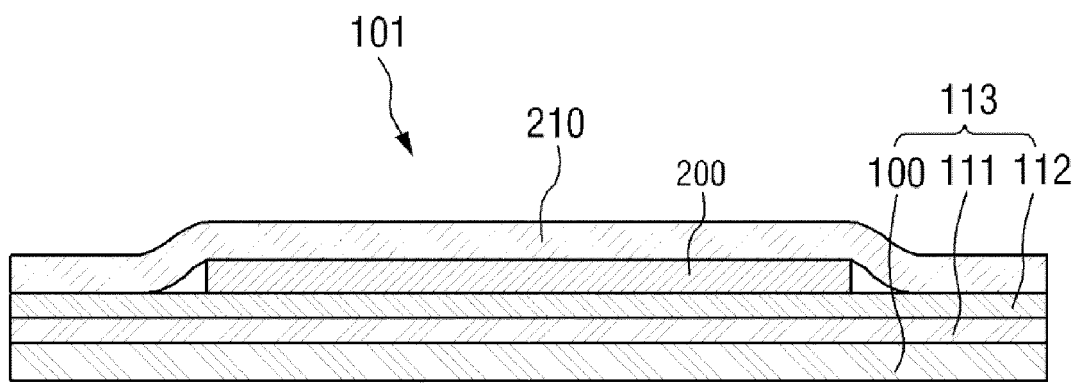
FIG. 9 is a cross-sectional view of a substrate laminated structure according to an embodiment of the disclosed technology.

FIG. 9 is a cross-sectional view of a substrate laminated structure according to an embodiment of the disclosed technology.

Referring to FIG. 9, the substrate laminated structure 101 may include a substrate laminating lower film 113, a target substrate 200 disposed on a second adhesion layer 112 of the substrate laminating lower film 113, and a doner film 210 covering the target substrate 200 and the second adhesion layer 112 and at least partially attached to the second adhesion layer 112.

Here, the substrate laminating lower film 113 shown in FIG. 1 is an exemplary implementation of a substrate laminating lower film and is provided only for illustration. Other substrate laminating lower films according to some other embodiments of the disclosed technology may also be used as the substrate laminating lower film 113.

The target substrate 200 may be disposed on the substrate laminating lower film 113. Specifically, the target substrate 200 may be disposed on a central portion of the substrate laminating lower film 113. The target substrate 200 may be adhered to the second adhesion layer 112 of the substrate laminating lower film 113.

The doner film 210 may be disposed on the target substrate 200. The doner film 210 completely covers the target substrate 200. The peripheries of the doner film 210 extend beyond edge portions of the target substrate 200 and are adhered to the second adhesion layer 112 of the substrate laminating lower film 113.

The doner film 210 may include a base member and a transfer layer. Like the above-described base member 100, the base member of the doner film 210 may be made of polyethylene terephthalate (PET), polystyrene (PS), or polyphenylene ether.

The transfer layer may include a material layer transferred to the target substrate 200. The material layer may include an organic material for forming an organic light emitting layer.

The doner film 210 may further include other layers, including a UV curable layer, a light-to-heat conversion layer, and the like, in addition to the base member and the transfer layer.

The UV curable layer may be easily adhered to the substrate laminating lower film 113 and function to prevent non-uniformity from occurring in a subsequent peeling process. The UV curable layer may be formed using at least one of a photoinitiator, a pre-polymer, a monomer, and a suitable solvent.

The light-to-heat conversion layer may convert light energy transferred to the doner film 210 into heat energy to then transfer the transfer layer to the target substrate 200.

The substrate laminated structure 101 may maintain stable adhesion between the doner film 210 and the target substrate 200 and easily peel peeling the substrate laminating lower film 113 until the transferring of the transfer layer is completed and the transfer layer is conveyed.

Hereinafter, a method of manufacturing an organic light emitting display apparatus using the substrate laminating lower film will be described.

Figure 10:
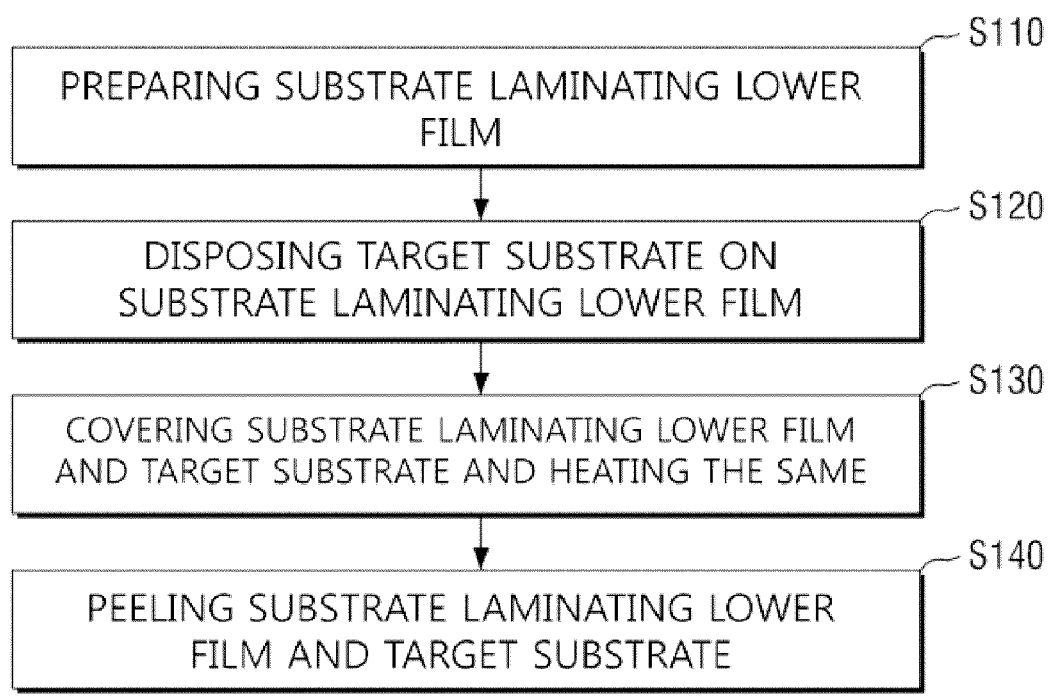
FIG. 10 is a flowchart of a method of manufacturing an organic light emitting display apparatus according to an embodiment of the disclosed technology.
Figure 11:
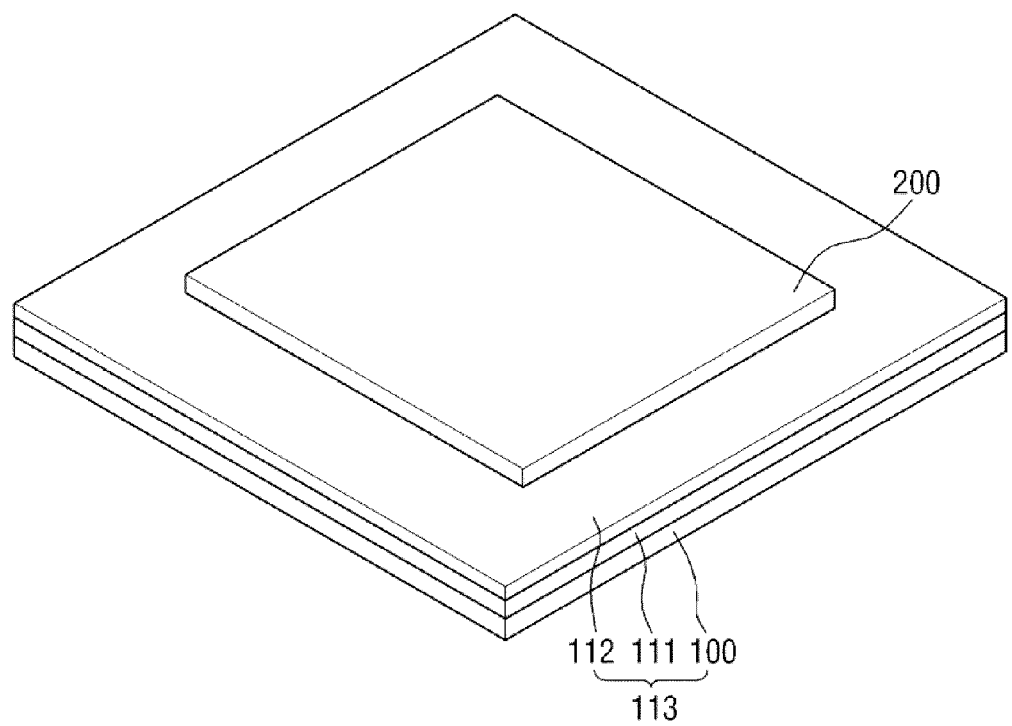
FIGS. 11, 13 and 15 are perspective views illustrating process steps of an organic light emitting display apparatus according to an embodiment of the disclosed technology
Figure 12:
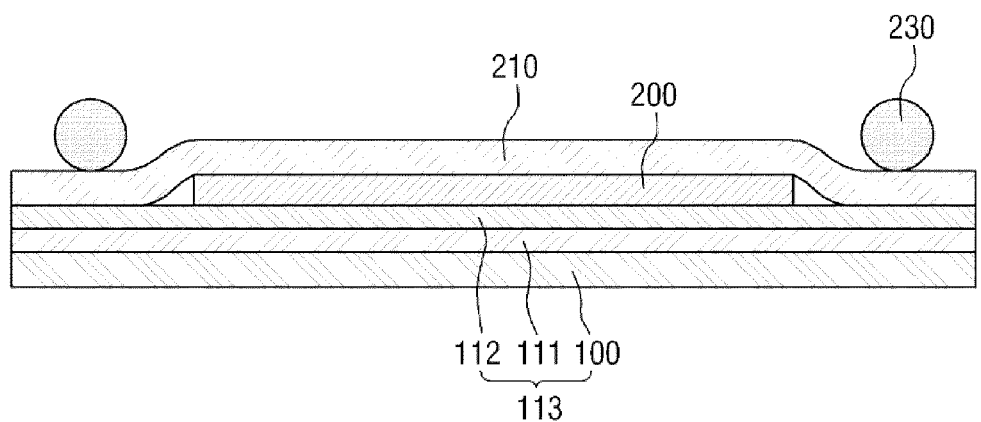
FIGS. 12 and 14 are cross-sectional views illustrating process steps of an organic light emitting display apparatus according to an embodiment of the disclosed technology.
Figure 13:
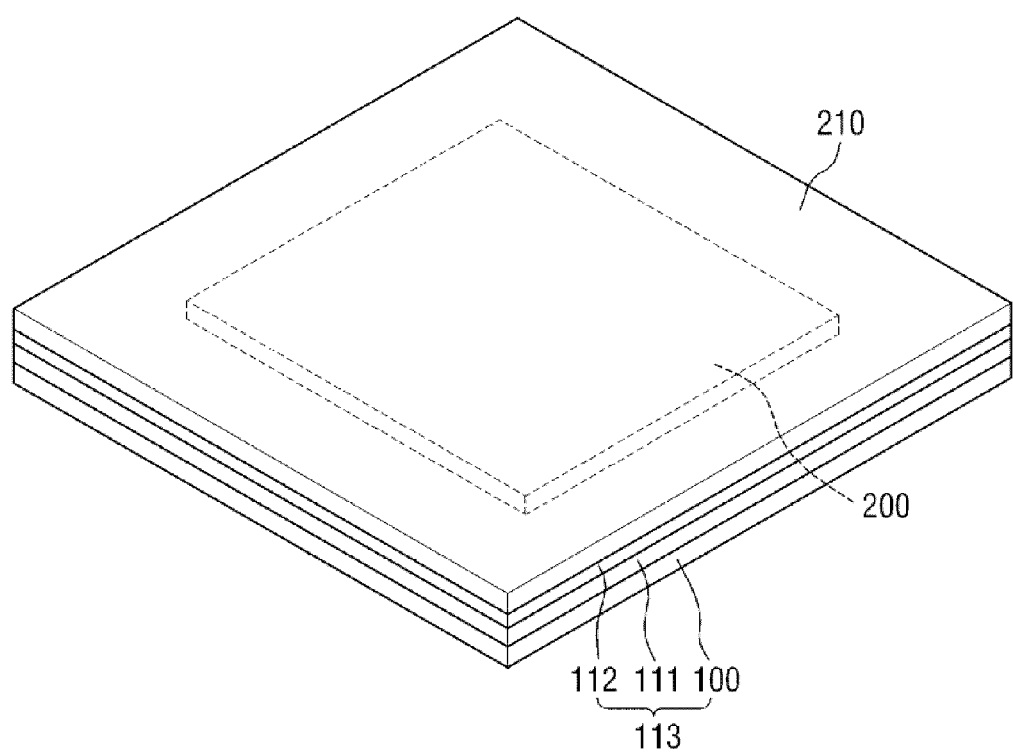
Figure 14:
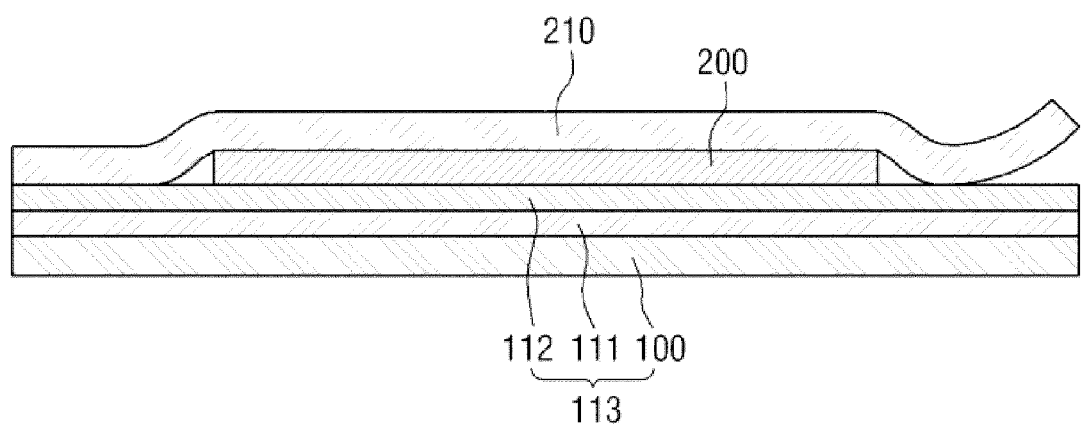
Figure 15:
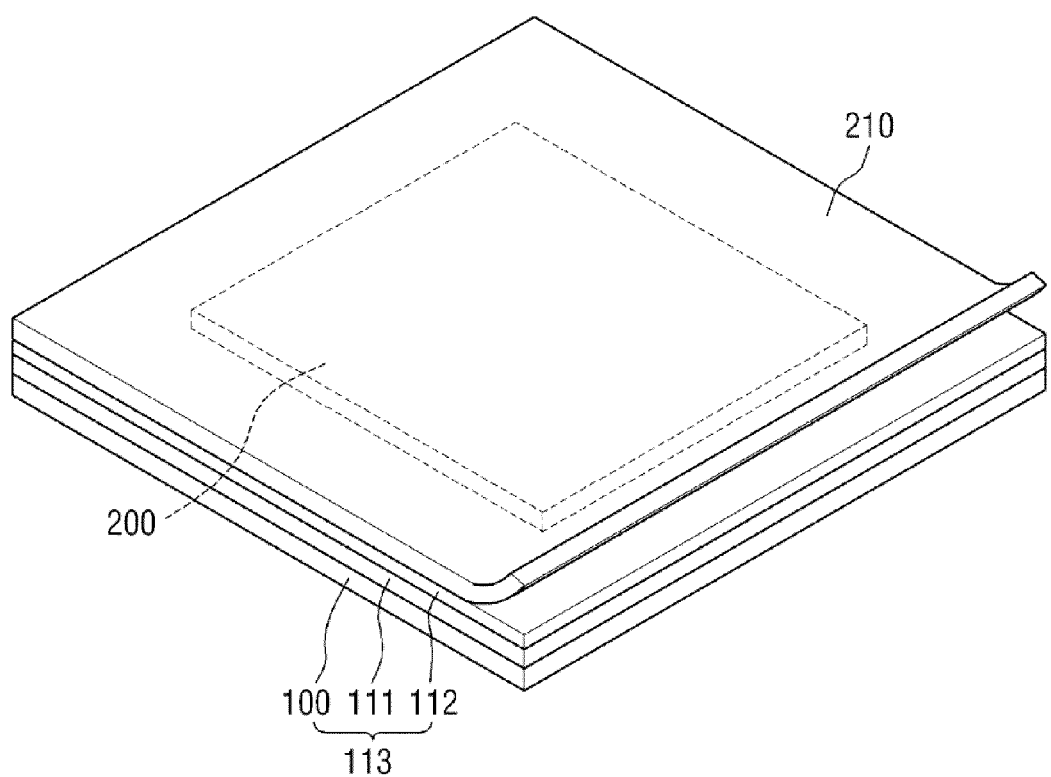

FIG. 10 is a flowchart of a method of manufacturing an organic light emitting display apparatus according to an embodiment of the disclosed technology. FIGS. 11, 13 and 15 are perspective views illustrating process steps of an organic light emitting display apparatus according to an embodiment of the disclosed technology and FIGS. 12 and 14 are cross-sectional views illustrating process steps of an organic light emitting display apparatus according to an embodiment of the disclosed technology.

Referring to FIGS. 10 and 11, first, a substrate laminating lower film 113 is prepared (S110). The substrate laminating lower film 113 has the same configuration as that shown in FIG. 10. At the same time, the target substrate 200 and the doner film 210 are prepared. A target substrate for use in an organic light emitting display apparatus may be used as the target substrate 200. Here, the substrate laminating lower film 113 is larger than the target substrate 200 in size.

Next, the target substrate 200 is disposed on the substrate laminating lower film 113 (S120).

The target substrate 200 is disposed at a central portion of the substrate laminating lower film 113. Since the substrate laminating lower film 113 is larger than the target substrate 200, it may be partially exposed in the peripheries of the target substrate 200 substrate laminating lower film 113 when the target substrate 200 is disposed on the substrate laminating lower film 113.

Referring to FIGS. 10, 12 and 13, the substrate laminating lower film and the target substrate are heated while being covered by the doner film (S130).

The doner film 210 larger than the target substrate 200 is disposed on the target substrate 200. The doner film 210 covers a top surface of the target substrate 200 and surrounds sides of the target substrate 200. The peripheries of the doner film 210 are placed on the second adhesion layer 112 of the exposed substrate laminating lower film 113. Strengthened adhesion has yet to be exhibited at contact portions between the substrate laminating lower film 113 and the doner film 210.

Next, the contact portions between the substrate laminating lower film 113 and the doner film 210 are heated to more firmly adhere the substrate laminating lower film 113 to the doner film 210. When the contact portions between the substrate laminating lower film 113 and the doner film 210 are heated, the contact portions may be selectively heated or relatively intensely heated.

For the purpose of performing heating, a heating rod 230 may be used. The heating using the heating rod 230 comprises heating the peripheries of the target substrate 200 covered by the doner film 210, thereby providing adhesion to the contact portions between the substrate laminating lower film 113 and the doner film 210. In an exemplary embodiment, the heating rod 230 may be shaped of a straight line, and a couple of rods may constitute a heating rod set. The respective rods are spaced greater than a width of the target substrate 200 apart from each other to be arranged around opposite sides of the target substrate 200, and the target substrate 200 is positioned between the respective rods. At this step, heated portions of the contact portions between the substrate laminating lower film 113 and the doner film 210 may have strengthened adhesion, thereby laminating the substrate laminating lower film 113 and the doner film 210. Thereafter, arranging the heating rod 230 around the other opposite sides of the target substrate 200 and heating the same may further be performed target substrate 200. As the result, the doner film 210 around all of the sides of the target substrate 200 may be attached to the substrate laminating lower film 113.

In some other embodiments, the heating rod 230 is shaped of a rectangle frame, peripheries of the substrate laminating lower film 113 making contact with the doner film 210 can be adhered just by one-time heating.

Meanwhile, adhesion exhibited positions between the substrate laminating lower film 113 and the doner film 210 may vary according to the portion contacting with the heating rod 230.

In an exemplary implementation, the heating rod 230 heat the doner film 210 while pressing a top surface of the doner film 210. In another exemplary implementation, if the heating rod 230 is positioned on the top surface of the doner film 210, heat emitted from the heating rod 230 propagates to internal structures of the doner film 210, a base member, a transfer layer, etc., and is transferred to a top portion of the second adhesion layer 112. The top portion of the second adhesion layer 112 is the topmost one among components of the substrate laminating lower film 113. If the second adhesion layer 112 is heated to its melting point or higher by the heat transferred to the top portion of the second adhesion layer 112, crystallinity of a material forming the second adhesion layer 112 is broken and strengthened adhesion is exhibited at a surface of the second adhesion layer 112. The second adhesion layer 112 having strengthened adhesion and the doner film 210 may be more firmly adhered to each other. However, the second adhesion layer 112 may have weaker adhesion than the first adhesion layer 111, and the adhesion exhibited may be controlled not to be high enough to permanently adhere the second adhesion layer 112 and the doner film 210 to each other as the result of heating. The controlling may be achieved by adjusting a heating method and a heating temperature, which will later be described in detail.

Meanwhile, heat is less transferred to the first adhesion layer 111 under the second adhesion layer 112 than to the second adhesion layer 112. Therefore, even if the second adhesion layer 112 is heated to its melting point or higher to then change crystallinity of the material forming the second adhesion layer 112, crystallinity of the first adhesion layer 111 may be maintained because the first adhesion layer 111 is not heated to its melting point or higher. Further, as described above, if the first adhesion layer 111 is formed of a material having a higher melting point than the second adhesion layer 112, the first adhesion layer 111 can be stably maintained to be at a temperature of its melting point or less. Accordingly, it is possible to prevent poor adhesion between the first adhesion layer 111 and the base member 100, which may caused when crystallinity of the first adhesion layer 111 is broken.

As described above, the heating using the heating rod 230 may provide non-permanent adhesion to the contact portions between the substrate laminating lower film 113 and the doner film 210 by adjusting the heating method and the heating temperature.

In an exemplary embodiment, impulse heating is selected as the heating using the heating rod 230. In the impulse heating, heat is emanated from the heating rod 230 for a short time. In an exemplary implementation, heat in a range of 100 to 120° C. is instantaneously emanated. In details, a desired maximum heating temperature may be controlled to be within a range of 100 to 120° C., and the heating is performing for 1 to 3 seconds while maintaining the maximum heating temperature reached after the heating is started. Accordingly, the contact portions between the substrate laminating lower film 113 and the doner film 210 disposed to be adjacent to each other may be instantaneously heated. Crystallinity of only a top portion of the second adhesion layer 112 of the substrate laminating lower film 113 may be broken through heat transfer and strengthened adhesion may be exhibited, thereby allowing the substrate laminating lower film 113 to be adhered to the doner film 210. Since heating is instantaneously performed, the heat may not be sufficiently transferred to components of the substrate laminating lower film 113, other than the second adhesion layer 112, that is, the first adhesion layer 111 and the base member 100. As the result, the first adhesion layer 111 and the base member 100 may not undergo a property change, and adhesion therebetween can be maintained.

Although not shown, a transfer layer of the doner film 210 is transferred to a target substrate. Thereafter, the substrate laminated structure may be conveyed to be subjected to a peeling process.

Referring to FIGS. 10, 14 and 15, the substrate laminating lower film 113 and the doner film 210 are peeled (S140).

Since the contact portions between the substrate laminating lower film 113 and the doner film 210 adhered by heating is non-permanently adhered, the adhered portions of the substrate laminating lower film 113 and the doner film 210 can be peeled using an appropriate peeling method.

In more details, as the result of heating, the doner film 210 covering a top portion of the target substrate 200 is adhered to the second adhesion layer 112 while surrounding the sides of the target substrate 200. In the substrate laminating lower film 113, the second adhesion layer 112 is adhered to the doner film 210 with weak adhesion. However, the first adhesion layer 111 of the substrate laminating lower film 113 is firmly adhered to the second adhesion layer 112 and the base member 100. In an exemplary implementation, the adhesion between the first adhesion layer 111 and the second adhesion layer 112 is stronger than the adhesion between the second adhesion layer 112 and the doner film 210. Likewise, the adhesion between the first adhesion layer 111 and the base member 100 is stronger than the adhesion between the second adhesion layer 112 and the doner film 210. If a tear-off force during a peeling process is greater than the adhesion between the second adhesion layer 112 and the doner film 210 and smaller than the adhesion between the first adhesion layer 111 and the second adhesion layer 112 or the adhesion between the first adhesion layer and the base member 100, only the adhered portions of the second adhesion layer 112 and the doner film 210 can be selectively peeled. In addition, the adhesion between the first adhesion layer 111 and the second adhesion layer 112 is increased, so that a portion of the second adhesion layer 112 may not be ruptured during the peeling process and the second adhesion layer 112 and the doner film 210 can be definitely separated from each other.

In an embodiment, an insertion unit is used to make the substrate laminating lower film 113 and the doner film 210 easily separated from each other. Examples of the insertion unit may include a blade. The insertion unit is inserted into directly adhered portions of the substrate laminating lower film 113 and the doner film 210 to separate the second adhesion layer 112 of the substrate laminating lower film 113 from the doner film 210.

In another exemplary embodiment of the disclosed technology, an apparatus for manufacturing an organic light emitting diode display is disclosed. The apparatus comprises means for forming a substrate laminating lower film. The means for forming the substrate may include the substrate laminating lower film 113 and the substrate laminating lower film 113 includes the base member 100, the first adhesion layer 111 and the second adhesion layer 112. In some implementations, the first adhesion 111 is formed on the base member 100 and having first adhesion, and the second adhesion layer 112 is formed on the first adhesion layer 111 and having second adhesion less than the first adhesion. In addition, the apparatus further comprises means for disposing a target substrate on the substrate laminating lower film. The means for disposing the target substrate on the substrate laminating lower film may include the target substrate 200 and the substrate laminating lower film 113. Moreover, the apparatus further comprises means for disposing a doner film on the lower film and the target substrate. The means for disposing the doner film may include the doner film 210, the substrate laminating lower film 113 and the target substrate 200.

For purposes of summarizing the disclosed technology, certain aspects, advantages and novel features of the disclosed technology have been described herein. It is to be understood that not necessarily all such advantages may be achieved in accordance with any particular embodiment of the disclosed technology. Thus, the disclosed technology may be embodied or carried out in a manner that achieves or optimizes one advantage or group of advantages as taught herein without necessarily achieving other advantages as may be taught or suggested herein.

Various modifications of the above described embodiments will be readily apparent, and the generic principles defined herein may be applied to other embodiments without departing from the spirit or scope of the disclosed technology. Thus, the disclosed technology is not intended to be limited to the embodiments shown herein but is to be accorded the widest scope consistent with the principles and novel features disclosed herein.

While the disclosed technology has been particularly shown and described with reference to exemplary embodiments thereof, it will be understood by those of ordinary skill in the art that various changes in form and details may be made therein without departing from the spirit and scope of the disclosed technology as defined by the following claims. It is therefore desired that the present embodiments be considered in all respects as illustrative and not restrictive, reference being made to the appended claims rather than the foregoing description to indicate the scope of the invention.

What is claimed is:

1. An apparatus for laminating a substrate structure, the apparatus comprising:
    a base member;
    a first adhesion layer having a first surface formed on the base member and a second surface opposing the first surface, wherein the first adhesion layer is formed of a first material having a first adhesion strength; and
    a second adhesion layer formed on the second surface of the first adhesion layer and formed of a second material having a second adhesion strength less than the first adhesion strength, wherein adhesion strength is a bonding force of an interface between an adhesion layer and an object to be adhered;
    a donor film covering the first adhesion layer and the second adhesion layer and having a central portion and a peripheral portion surrounding the central portion,
    a target substrate formed between the donor film and the base member, wherein the donor film comprises a material to be transferred to the target substrate, wherein the second adhesion layer defines an open window at its central portion and is formed on an edge of the first adhesion layer, wherein the first adhesion layer is exposed by the open window of the second adhesion layer, and wherein the open window has a closed loop shape.

2. The apparatus of claim 1, wherein the first adhesion layer has a melting point greater than a melting point of the second adhesion layer.

3. The apparatus of claim 1, wherein the melting point of the second adhesion layer is in a range of 80 to 100° C.

4. The apparatus of claim 1, further comprising a barrier layer interposed between the first adhesion layer and the base member.

5. The apparatus of claim 1, further comprising a primer layer interposed between the first adhesion layer and the base member.

6. The apparatus of claim 1, wherein a thickness of the first adhesion layer is larger than that of the second adhesion layer.

7. The apparatus of claim 1,
wherein the target substrate is formed on the second adhesion layer, and
wherein the donor film covers the target substrate and has at least one portion attached to the second adhesion layer.

8. The apparatus of claim 7, wherein the size of a combination of the base substrate and first and second adhesion layers is greater than that of the target substrate.

9. The apparatus of claim 1, wherein the second adhesion layer is configured to receive heat in the range of about 100° C. to about 120° C.

10. The apparatus of claim 9, wherein the second adhesion layer is further configured to receive the heat for about 1 second to about 3 seconds.

11. The apparatus of claim 1, wherein the target substrate is formed on the first adhesion layer, and wherein the thickness of the second adhesion layer is smaller than that of the target substrate.

12. The apparatus of claim 1, wherein the peripheral portion of the donor film contacts the second adhesion layer.

\* \* \* \* \*